United States Patent
Corso

(10) Patent No.: US 11,887,747 B2
(45) Date of Patent: Jan. 30, 2024

(54) ACQUEOUS COMPOSITION COMPRISING A CONDUCTIVE POLYMER AND USE THEREOF

(71) Applicant: ENI S.P.A., Rome (IT)

(72) Inventor: Gianni Corso, Novara (IT)

(73) Assignee: ENI S.P.A., Rome (IT)

( * ) Notice: Subject to any disclaimer, the term of this patent is extended or adjusted under 35 U.S.C. 154(b) by 379 days.

(21) Appl. No.: 16/758,914

(22) PCT Filed: Oct. 24, 2018

(86) PCT No.: PCT/IB2018/058286
§ 371 (c)(1),
(2) Date: Apr. 24, 2020

(87) PCT Pub. No.: WO2019/082088
PCT Pub. Date: May 2, 2019

(65) Prior Publication Data
US 2021/0183534 A1   Jun. 17, 2021

(30) Foreign Application Priority Data
Oct. 25, 2017  (IT) .................. 102017000121038

(51) Int. Cl.
| | |
|---|---|
| H01B 1/00 | (2006.01) |
| C09D 5/24 | (2006.01) |
| H01B 1/12 | (2006.01) |
| C08G 61/12 | (2006.01) |
| C09D 11/102 | (2014.01) |
| H10K 71/15 | (2023.01) |
| H10K 85/10 | (2023.01) |
| B05D 5/12 | (2006.01) |

(52) U.S. Cl.
CPC .............. *H01B 1/127* (2013.01); *B05D 5/12* (2013.01); *C08G 61/126* (2013.01); *C09D 11/102* (2013.01); *H10K 71/15* (2023.02); *H10K 85/1135* (2023.02); *C08G 2261/1424* (2013.01); *C08G 2261/3223* (2013.01)

(58) Field of Classification Search
CPC .......... H01B 1/124; H01B 1/127; C09D 5/24; C09D 11/02; B05D 5/12
See application file for complete search history.

(56) References Cited

U.S. PATENT DOCUMENTS

| | | | | |
|---|---|---|---|---|
| 6,358,437 | B1 * | 3/2002 | Jonas | H01B 1/127 252/500 |
| 2003/0062510 | A1 * | 4/2003 | Van den Bogaert | C09D 11/106 252/500 |
| 2005/0220992 | A1 * | 10/2005 | Tahon | C09D 11/52 427/161 |
| 2014/0166938 | A1 * | 6/2014 | Jin | H01B 1/127 252/500 |
| 2016/0196892 | A1 * | 7/2016 | Ohori | G06F 3/041 345/173 |

FOREIGN PATENT DOCUMENTS

| | | |
|---|---|---|
| WO | 2003000765 A2 | 1/2003 |
| WO | 2003048229 A1 | 6/2003 |
| WO | WO 2009007361 * | 1/2009 |

OTHER PUBLICATIONS

Gemeiner et al "Pt-free counter electrodes based on modified screen-printed PEDOT:PSS catalytic layers for dye-sensitized solar cells", Materials Science in Semiconductor Processing 66 (Aug. 2017) 162-169.*
Akerfeldt et al "Electrically conductive textile coating with a PEDOT-PSS dispersion and a polyurethane binder", Textile Research Journal 83(6) 618-627 (2013).*
International Search Report dated Dec. 12, 2018 for PCT application No. PCT/IB2018/058286.
Written Opinion dated Dec. 12, 2018 for PCT application No. PCT/IB2018/058286.

* cited by examiner

*Primary Examiner* — Mark Kopec
(74) *Attorney, Agent, or Firm* — Ruggiero McAllister & McMahon LLC

(57) ABSTRACT

Aqueous composition comprising:
  from 0.5% by weight to 5% by weight, preferably from 1% by weight to 4% by weight, with respect to the total weight of said aqueous composition, of at least one conductive polymer;
  from 1% by weight to 100% by weight, preferably from 2% by weight to 10% by weight, more preferably from 15% by weight to 50% by weight, with respect to the total weight of said at least one conductive polymer, of at least one cellulose ether.

Said aqueous composition may advantageously be used as a printable ink or printable paste in various techniques such as, for example, screen printing, gravure printing, flexographic printing, spray coating, slot die coating, spin-coating, ink-jet printing. Preferably, said aqueous composition may advantageously be used as a printable paste for screen printing. More particularly, said aqueous composition may be used for the preparation of electrically organic conductive layers, even more particularly for the preparation of electrically organic conductive layers used in photovoltaic cells (or solar cells), in printable electronics, in organic light-emitting diodes (OLEDs), in touch screens, in antistatic coatings.

19 Claims, No Drawings

ACQUEOUS COMPOSITION COMPRISING A CONDUCTIVE POLYMER AND USE THEREOF

The present invention relates to an aqueous composition comprising a conductive polymer.

More particularly, the present invention relates to an aqueous composition comprising at least one conductive polymer and at least one cellulose ether.

Said aqueous composition may advantageously be used as a printable ink or printable paste in various techniques such as, for example, screen printing, gravure printing, flexographic printing, spray coating, slot die coating, spin-coating, ink-jet printing.

Preferably, said aqueous composition may advantageously be used as a printable paste for screen printing. More particularly, said aqueous composition may be used for the preparation of electrically organic conductive layers, even more particularly for the preparation of electrically organic conductive layers used in photovoltaic cells (or solar cells), in printable electronics, in organic light-emitting diodes (OLEDs), in touch screens, in antistatic coatings.

The present invention further relates to a printable ink or printable paste, preferably a printable paste, including an aqueous composition comprising at least one conductive polymer and at least one cellulose ether.

The present invention further relates to the use of an aqueous composition comprising at least one conductive polymer and at least one cellulose ether for the preparation of electrically organic conductive layers, even more particularly for the preparation of electrically organic conductive layers used in photovoltaic cells (or solar cells), in printable electronics, in organic light-emitting diodes (OLEDs), in touch screens, in antistatic coatings.

In the simplest mode of operation, the organic, direct-architecture photovoltaic cells (or solar cells) are manufactured by introducing between two electrodes, usually consisting of indium-tin oxide (ITO) (anode) [in the case of photovoltaic cells (or solar cells) having reversed architecture the anode may consist of silver] and aluminium (Al) or silver (Ag) (cathode), a thin layer (for example 100 nm-150 nm) of a mixture of at least one electron acceptor compound [for example, PC61BM (6,6-phenyl-$C_{61}$-methyl butyric ester) or PC71BM (6,6-phenyl-$C_{71}$-methyl butyric ester)] and of at least one electron donor compound [selected, for example, from polythiophenes, polycarbazoles, derivatives of poly(thienothiophene)benzodithiophene (PTB)] (an architecture known as a "bulk heterojunction"). Generally, for the purpose of implementing a layer of this type, a solution of the two compounds is prepared, and subsequently a photoactive layer is created on the anode [for example, indium-tin oxide (ITO)] starting from said solution, using suitable deposition techniques such as, for example, spin-coating, spray coating, inkjet printing, and the like. Finally, on the dried layer, the counter electrode is deposited [i.e. the aluminium (Al) or silver (Ag) cathode]. To guarantee better performance of the photovoltaic cells (or solar cells), other additional layers (also known as interlayers or buffer layers) may be introduced between the electrodes and the photoactive layer to perform specific electrical, optical, or mechanical functions.

As a result, generally, for the purpose of helping the electron holes to reach the anode [generally, indium tin oxide (ITO) or silver] and at the same time to stop electrons being carried, thus improving the charges harvesting by the electrode and inhibiting recombination phenomena, before creating the photoactive layer from the mixture of the acceptor compound and the donor compound as described above, an organic electrically conductive layer is created from an aqueous suspension based on PEDOT:PSS [poly(3,4-ethylenedioxythiophene)-polystyrene sulphonate—for simplicity referred to hereinafter merely as PEDOT:PSS], using suitable coating or printing techniques such as, for example, spin-coating, spray coating, ink-jet printing, screen printing, and the like.

Further details on the various deposition techniques used for manufacturing photovoltaic cells (or solar cells) may be found, for example, in the F. C. Krebs review "Fabrication and processing of polymer solar cells: A review of printing and coating techniques", "*Solar Energy Materials & Solar Cells*" (2009), Vol. 93, pp. 394-412.

Said electrically conductive organic layer, has various functions within the photovoltaic cell (or solar cell) and, in any case, must have good electrical conductivity, be deposited or printed without a continuity solution and not exhibit defects at the end of deposition or printing. Indeed, other conditions being equal, good electrical conductivity values and maintenance thereof, guarantee good performance of the photovoltaic device (or solar device) in which said photovoltaic cell (or solar cell) is used, since the resistive dissipations of the current and voltage generated in said photovoltaic device (or solar device) are minimised. Furthermore, good electrical conductivity values are found to be particularly important when the thicknesses of the electrically conductive organic layer based on PEDOT:PSS are high (i.e. greater than 50 nm-100 nm), or when the PEDOT:PSS itself is used as an electrode, in place of, or in combination with other electrically conductive materials such as silver, aluminium, or the like, optionally nanodispersed or structured in various forms such as grids, fingers, busbars. The presence of defects in the surface of said electrically conductive organic layer based on PEDOT:PSS (for example, holes) further entails reductions, which are also significant, in the efficiency of the photovoltaic device (or solar device) containing it and a deterioration in the electrical parameters in general.

Further, another important aspect relates to the accuracy of the form and dimensions of said deposited or printed electrically conductive organic layer, such as for example in cases where complex figures or modules are implemented. Good success of the deposition or printing is closely related to the rheological features of the aqueous suspension used. In particular, if pastes for screen printing are implemented, problems may be encountered related to the need to obtain high viscosities whilst simultaneously preventing the charge of inert compounds (e.g., additives) introduced for this purpose from reducing the conductivity of the layers obtained. Further, the introduction of said inert compounds to increase the viscosity of the aqueous suspension generally also entails a decrease in the conductivity of the final layer: as a result, the two effects have to be suitably balanced.

The aforementioned problems are typical of the production of photovoltaic cells (or solar cells), whether these are conventional (direct-architecture) cells or, in particular, photovoltaic cells (or solar cells) with an inverted structure, where said electrically conductive organic layer based on PEDOT:PSS is deposited above the photoactive layer, with thicknesses generally higher than is the case for conventional (direct-architecture) photovoltaic cells (or solar cells). The deposition of said electrically conductive organic layer based on PEDO:PSS on the photoactive layer is known in the literature as a source of uniformity problems thereof, as reported, for example, at the following Web site: http://www.heraeus-clevios.com/en/technology/spin-coating-ofclevios-p.aspx, in particular for the formation of holes as a result of the high surface tension of inks containing water-based PEDOT:PSS and the relatively high hydrophobicity of the photoactive layer on which the electrically conductive organic layer based on PEDOT:PSS is deposited. The possible printing techniques used for depositing the electrically conductive organic layer based on PEDOT:PSS are reported in the aforementioned F. C. Krebs review. The most common printing techniques, namely screen printing, gravure printing, flexographic printing, spray coating, slot die coating, spin-coating, ink-jet printing, require inks having a viscosity range, at 25° C., ranging from 10 mPa×s to $10^4$ mPa×s–$10^5$ mPa×s.

Inks or pastes useful for the purpose of obtaining electrically conductive organic layers are known in the art.

For example, U.S. Pat. No. 6,358,437 describes a screen printing paste comprising a solution or dispersion containing a conductive polymer and a solvent selected from the group consisting of alcohols, ketones and amides, said alcohols, ketones and amides being at least partially miscible with water; and having a viscosity ranging from 8 dPas (800 cP) to 200 dPas (20000 cP), said paste containing at least 2% by weight of said conductive polymer. The above-mentioned paste is said to be advantageously usable for producing electrically conductive coatings.

U.S. Pat. No. 6,955,772 describes an aqueous composition containing: a (co)polymer of a 3,4-dialkoxythiophene in which the two alkoxy groups may be identical or different or together represent an optionally substituted oxy-alkylene-oxy bridge; a polyanion; and a non-Newtonian binder, in which said non-Newtonian binder is a polyacrylate. The above-mentioned aqueous composition is said to be advantageous usable for the purpose of preparing electrically conductive layers, electrically conductive coatings, pastes or printable inks.

However, the printable inks and pastes known in the art, generally obtained simply by adding additives which modify the viscosity thereof, provide electrically conductive organic layers having rather high surface resistivity values (i.e., in the best cases, values greater than or equal to 700 Ω/sq) and, as a result, a significant loss of electrical conductivity. Further, in other cases, for the purpose of preventing or reducing the addition of additives and thus maintaining a higher electrical conductivity, the printable paste is prepared by reducing the volume of the starting solution (for example, of the commercial PEDOT:PSS solution) by evaporation: this operation is onerous both in terms of energy and in terms of the plant, with a resulting increase in the process times and costs.

The Applicant has therefore taken on the problem of finding an aqueous composition which can advantageously be used as a printable ink or printable paste in the various aforementioned techniques and which is further usable for the preparation of electrically conductive organic layers having low surface resistivity values (i.e., values less than or equal to 500 Ω/sq) and, as a result, good electrical conductivity.

The Applicant has now found an aqueous composition comprising at least one conductive polymer and at least one cellulose ether, in specific amounts, which can advantageously be used as a printable ink or printable paste in the various aforementioned techniques and which is further usable for the preparation of electrically conductive organic layers having low surface resistivity values (i.e., values less than or equal to 500 Ω/sq) and, as a result, good electrical conductivity. Further, said aqueous composition may be obtained by a simple, inexpensive process which does not necessitate, for example, reduction in the volume of the starting solution by evaporation. Thus, one subject matter of the present invention is an aqueous composition comprising:

from 0.5% by weight to 5% by weight, preferably from 1% by weight to 4% by weight, with respect to the total weight of said aqueous composition, of at least one conductive polymer;

from 1% by weight to 100% by weight, preferably from 2% by weight to 10% by weight, more preferably from 15% by weight to 50% by weight, with respect to the total weight of said at least one conductive polymer, of at least one cellulose ether.

Said aqueous composition may advantageously be used as a printable ink or printable paste in various techniques such as screen printing, gravure printing, flexographic printing, spray coating, slot die coating. Preferably, said aqueous composition may advantageously be used as a printable paste for screen printing. More particularly, said aqueous composition may advantageously be used for the preparation of electrically conductive organic layers, even more particularly for the preparation of electrically conductive layers usable in photovoltaic cells (or solar cells), in printable electronics, in organic light-emitting diodes (OLEDs), in touch screens, in antistatic coatings.

It should be noted that for the purpose of the present invention said at least one cellulose ether is preferably used in an amount ranging from 15% by weight to 50% by weight with respect to the total weight of said at least one conductive polymer in the case of screen printing and from 2% by weight to 10% by weight with respect to the total weight of said at least one conductive polymer in the case of the other aforementioned techniques.

For the purpose of the present description and of the following claims, the definitions of numerical ranges always include the endpoints unless specified otherwise.

For the purpose of the present description and of the following claims, the term "comprising" also includes the terms "substantially consisting of" or "consisting of".

In a preferred embodiment of the present invention, said conductive polymer may be selected from (co)polymers of a 3,4-dialkoxythiophene.

In a further preferred embodiment of the present invention, said (co)polymers of a 3,4-dialkoxythiophene may be selected, for example, from (co)polymers comprising repeating units having general formula (I):

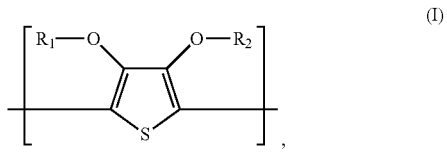

in which $R_1$ and $R_2$, identical or different, represent a hydrogen atom; or are selected from $C_1$-$C_4$ alkyl groups; or $R_1$ and $R_2$ together represent a $C_1$-$C_5$ alkylene group or a cycloalkylene group In a further preferred embodiment of the present invention, said (co)polymers of a 3,4-dialkoxythiophene may be selected, for example, from (co)polymers of a 3,4-dialkoxythiophene in which the two alkoxy groups together represent an optionally substituted oxy-alkylene-oxy bridge, preferably from: poly(3,4-methylenedioxythiophene) and its derivatives, poly(3,4 ethylenedioxythiophene) and its derivatives, poly(3,4-propylenedioxythiophene) and its derivatives, poly(3,4-butylenedioxythiophene) and its derivatives, or their copolymers, or mixtures thereof.

In a further preferred embodiment of the present invention, said (co)polymers of a 3,4-dialkoxythiophene may be selected, for example, from (co)polymers of a 3,4-dialkoxythiophene in which the two alkoxy groups together represent an oxy-alkylene-oxy bridge optionally substituted with one or more groups selected, for example, from: alkyl groups, alkoxy groups, alkyloxyalkyl groups, carboxyl groups, alkylsulphonate groups, arylsulphonate groups, ester groups.

In a further preferred embodiment of the present invention, in said (co)polymers of a 3,4-dialkoxythiophene the two alkoxy groups together represent a oxy-alkylene-oxy bridge in which the alkylene group is an optionally substituted 1,2-ethylene group, a methylene group optionally substituted with at least one alkyl group, a 1,2-ethylene group optionally substituted with at least one $C_1$-$C_{12}$ alkyl group, a 1,2-ethylene group optionally substituted with at least one phenyl group, a 1,3-propylene group, a 1,2-cyclohexylene group.

In a particularly preferred embodiment of the present invention, said (co)polymer of a 3,4-dialkoxythiophene is poly(3,4-ethylenedioxythiophene) (PEDOT).

(Co)polymers of a 3,4-dialkoxythiophene are known in the art: further details relating to said (co)polymers may be found, for example, in the L. Groenendaal review "Poly(3,4-ethylenedioxythiophene) and Its Derivatives: Past, Present and Future", *Advanced Materials* (2000), Vol. 12, Issue 7, pp. 481-494.

In a preferred embodiment of the present invention, said (co)polymers of a 3,4-dialkoxythiophene may be used together with a polyanion which may be selected, for example, from polyanions of polymeric carboxylic acids such as, for example, poly(meth)acrylic acids, polymaleic acids; polyanions of polysulphonic acids such as, for example, poly(styrenesulphonic) acid. Said polycarboxylic acids and said polysulphonic acids may further be copolymers of vinylcarboxylic and vinylsulphonic acids with other polymerisable monomers such as esters of (meth)acrylic acids, styrene. Preferably, said polyanion is a polyanion of poly(styrenesulphonic) acid or a polyanion of copolymers of poly(styrene sulphonic) acid with styrene.

Dispersions or solutions of (co)polymers of a 3,4-dialkoxythiophene with a polyanion which may advantageously be used for the purpose of the present invention and which are currently commercially available are the products Clevios™ PH 500, Clevios™ PH 1000, Clevios™ F HCSolar, from Heraeus.

In a particularly preferred embodiment of the present invention, said conductive polymer is PEDOT:PSS [poly(3,4-ethylenedioxythiophene)polystyrene sulphonate].

In a preferred embodiment of the present invention, said cellulose ether may be selected, for example, from: alkyl celluloses such as, for example, methylcellulose, ethylcellulose, propylcellulose, or mixtures thereof; hydroxyalkylcelluloses such as, for example, hydroxymethylcellulose, hydroxyethylcellulose, hydroxypropylcellulose, or mixtures thereof; hydroxyalkylalkylcelluloses such as, for example, hydroxyethylmethyl-cellulose, hydroxypropylmethylcellulose, or mixtures thereof; or mixtures thereof.

In a particularly preferred embodiment of the present invention, said cellulose ether is methylcellulose, hydroxypropylmethylcellulose; preferably hydroxypropylmethylcellulose.

In a further preferred embodiment of the present invention, said hydroxypropylmethylcellulose may have a methoxyl content of ranging from 16.5% by weight to 30% by weight and a hydroxypropoxyl content ranging from 4% by weight and 32% by weight, relative to the total weight of said hydroxypropylmethylcellulose.

Specific examples of cellulose ethers which may advantageously be used for the purpose of the present invention and which are currently commercially available are: Methocel® 90 HG, Methocel A, Methocel® E, Methocel® F and Methocel® K, from Dow.

For the purpose of increasing the electrical conductivity of the electrically conductive organic layer obtained from said aqueous composition, at least one compound may be added to said aqueous composition, said compound being selected, for example, from: sulphoxides, aprotic liquids having a dielectric constant greater than 15, diols, sugars, or mixtures thereof.

In a preferred embodiment of the present invention, said aqueous composition may comprise at least one compound which may be selected, for example, from: sulphoxides, aprotic liquids having a dielectric constant greater than 15, diols, sugars, or mixtures thereof; preferably sulphoxides.

In a further preferred embodiment of the present invention, said sulphoxides may be selected, for example, from: alkyl sulphoxides such as, for example, dimethyl sulphoxide (DMSO), diethyl sulphoxide, di-n-propyl sulphoxide, di-n-butyl sulphoxide, di-iso-amyl sulphoxide, or mixtures thereof; aryl sulphoxides such as, for example, benzyl phenyl sulphoxide, diphenyl sulphoxide, methyl phenyl sulphoxide, dibenzyl sulphoxide, di-p-tolyl sulphoxide, or mixtures thereof; or mixtures thereof. Dimethyl sulphoxide (DMSO) is preferred.

In a further preferred embodiment of the present invention, said aprotic liquids having a dielectric constant greater than 15 may be selected, for example, from: N-methylpyrrolidone, 1,3-dimethyl-2-imidazolidinone, 2-pyrrolidone, N,N,N',N'-tetramethylurea, formamide, N,N-dimethylformamide, N-methylacetamide, N,N-dimethylacetamide, tetramethylsulphoneurea, or mixtures thereof.

In a further preferred embodiment of the present invention, said diols may be selected, for example, from: diethylene glycol, propylene glycol, or mixtures thereof.

In a further preferred embodiment of the present invention, said sugars may be selected, for example, from: sorbitol, mannitol, sucrose, fructose, or mixtures thereof.

In a preferred embodiment of the present invention, said compound may be selected for example from sulphoxides, aprotic liquids having a dielectric constant greater than 15, diols, sugars, and may be used in an amount ranging from 2% by weight to 20% by weight, preferably ranging from 3% by weight to 8% by weight, with respect to the total weight of said aqueous composition.

For the purpose of improving the solubility of the cellulose ether in said aqueous composition and/or improving the wettability thereof, at least one organic solvent miscible with water may be added to said aqueous composition.

In a preferred embodiment of the present invention, said aqueous composition may comprise at least one organic solvent miscible with water.

In a further preferred embodiment of the present invention, said organic solvent may be selected, for example, from: alcohols such as, for example, methyl alcohol, ethyl alcohol, iso-propyl alcohol, or mixtures thereof; acetic acid esters such as for example, methyl acetate, ethyl acetate, n-propyl acetate, iso-propyl acetate, or mixtures thereof; ketones such as for example, acetone, methyl ethyl ketone, methyl iso-butyl ketone, cyclohexanone, or mixtures thereof; or mixtures thereof. Iso-propyl alcohol is preferred.

In one embodiment of the present invention, said organic solvent may be used in an amount ranging from 0.1% by weight to 70% by weight, preferably ranging from 10% by weight to 60% by weight, relative to the total weight of said aqueous composition.

Said aqueous composition may further contain other compounds such as, for example, pigments or organic or inorganic dyes, cross-linking agents, anti-foaming agents, surface active agents. The optional addition of any compounds is such that each compound, when present, may be present in an amount ranging from 0.01% by weight to 5 by weight, preferably ranging from 0.1% by weight to 2% by weight, with respect to the total weight of said aqueous composition.

In a preferred embodiment of the present invention, said aqueous composition may have a viscosity, at 25° C., ranging from 1 mPa×s to $10^5$ mPa×s, preferably ranging from 5 mPa×s to 1000 mPa×s, more preferably ranging from 1000 mPa×s to $10^5$ mPa.

It should be noted that for the purpose of the present invention said aqueous composition has a viscosity, at 25° C., preferably ranging from 1000 mPa×s to $10^5$ mPa×s in the case of screen printing and ranging from 5 mPa×s to 1000 mPa×s in the case of the other aforementioned techniques.

The aqueous composition object of the present invention may be prepared by processes known in the art. For example, said aqueous composition may be prepared by mixing the solution or dispersion of a (co)polymer of a 3,4-dialkoxythiophene-polyanion (for example, PEDOT:PSS) with at least one cellulose ether (for example, hydroxypropylmethylcellulose) and, optionally, at least one sulphoxide (for example, DMSO) and/or at least one organic solvent (for example, iso-propyl alcohol), and any other compounds present, at a temperature ranging from 20° C. to 30° C., for a time ranging from 10 minutes to 30 minutes, at a rotational speed ranging from 100 rpm to 600 rpm.

Said aqueous composition may advantageously be used as a printable ink or printable paste in various techniques such as screen printing, gravure printing, flexographic printing, spray coating, slot die coating, spin-coating, ink-jet printing. Preferably, said aqueous composition may advantageously be used as a printable paste for screen printing. It should be noted that the use of said aqueous composition in said various techniques is substantially dependent on the rheology thereof, in particular on the viscosity.

Thus, a further subject matter of the present invention is a printable ink or printable paste, preferably a printable paste, comprising said aqueous composition. More particularly, as stated above, said aqueous composition may be used for preparing electrically conductive organic layers, even more particularly for preparing electrically conductive organic layers usable in photovoltaic cells (or solar cells), in printable electronics, in organic light-emitting diodes (OLEDs), in touch screens, in antistatic coatings.

Thus, a further subject matter of the present invention is the use of said aqueous composition for preparing electrically conductive organic layers, more particularly for preparing electrically conductive organic layers usable in photovoltaic cells (or solar cells), in printable electronics, in organic light-emitting diodes (OLEDs), in touch screens, in antistatic coatings.

For the purpose of better understanding and implementing the present invention, some illustrative and non-limiting examples thereof are set out hereinafter.

EXAMPLE 1

Into a 10 ml vial, fitted with a plug, were loaded 2 ml of poly(3,4-ethylenedioxythiophene)-polystyrenesulphonate (PEDOT:PSS) (Clevios™ PH 1000 from Heraeus) (1.3% by weight with respect to the total weight of the aqueous composition), 0.19 g of a 5% aqueous solution of hydroxypropylmethylcellulose (Methocel® 90 HG from Sigma Aldrich) (approximately 37% by weight with respect to the total weight of PEDOT:PSS) and 0.09 ml dimethyl sulphoxide (DMSO) ("ACS reagent", purity ≥99.9%, from Sigma Aldrich): the whole was left, at 25° C., under stirring at 200 rpm, for 20 minutes. The paste thus obtained had a viscosity >$10^4$ mPa×s as measured at 25° C., at a shear rate of 1 $s^{-1}$ by way of a plate-cone measurement system using the MCR 302 rheometer from Anton-Paar.

The paste was subsequently printed using a polyester fabric screen having 55 filaments per cm (Estal® mono from Sefar) to give a 1 $cm^2$×0.5 $cm^2$ coating layer, and dried at 140° C., for 5 minutes. The coating layer had a surface resistivity of 360 Ω/sq as measured using a 4-point probe as described by L. J. van der Pauw, "A method of measuring specific resistivity and Hall effect of discs of arbitrary shape", "*Philips Research Reports*" (1958), Vol. 13, pp. 1-9.

Whilst operating as described above, a commercial ink, i.e. 5% by weight poly(3,4-ethylenedioxythiophene)-polystyrenesulphonate (PEDOT:PSS) (product No. 76865 from Sigma Aldrich), was printed for the purpose of comparison, obtaining a coating layer which had a surface resistivity, measured as described above, of 320 Ω/sq.

From the data set out above, it can be seen how the paste obtained in accordance with the present invention has a surface resistivity entirely similar to that of the reference commercial ink.

The invention claimed is:

1. Aqueous ink composition comprising:
   from 1% by weight to 4% by weight, with respect to the total weight of said aqueous composition, of at least one conductive polymer;
   from 15% by weight to 50% by weight, with respect to the total weight of said at least one conductive polymer, of at least one cellulose ether: and
   an amount of a pigment and/or a dye.

2. Aqueous ink composition according to claim 1, wherein said at least one conductive polymer is selected from (co)polymers of a 3,4-dialkoxythiophene.

3. Aqueous ink composition according to claim 2, wherein said (co)polymer of a 3,4-dialkoxythiophene is poly(3,4-ethylenedioxythiophene) (PEDOT).

4. Aqueous ink composition according to claim 2, wherein said (co)polymer of a 3,4-dialkoxythiophene is used together with a polyanion selected from the group consisting of polyanions of polymeric carboxylic acids; polyanions of polysulphonic acids.

5. Aqueous ink composition according to claim 1, wherein said conductive polymer is PEDOT: PSS [poly(3,4-ethylenedioxythiophene)-polystyrene sulphonate.

6. Aqueous ink composition according to claim 1, wherein said cellulose ether is selected from the group consisting of alkyl celluloses and mixtures thereof.

7. Aqueous ink composition according to claim 1, wherein said aqueous ink composition further comprises at least one compound selected from the group consisting of sulphoxides; aprotic liquids having a dielectric constant greater than 15; diols; sugars; or mixtures thereof;
   wherein said sulphoxides are selected from the group consisting of alkyl sulphoxides; aryl sulphoxides and mixtures thereof; and wherein said aprotic liquids having a dielectric constant greater than 15 are selected from the group consisting of N-methylpyrrolidone, 1,3-dimethyl-2-imidazolidinone, 2-pyrrolidone, N,N, N',N'-tetramethylurea, formamide, N,N-dimethylformamide, N-methylacetamide, N,N-dimethylacetamide, tetramethylsulphoneurea, and mixtures thereof;
wherein said diols are selected from the group consisting of diethylene glycol, propylene glycol, and mixtures thereof; and
wherein said sugars are selected from the group consisting of sorbitol, mannitol, sucrose, fructose, and mixtures thereof.

8. Aqueous ink composition according to claim 1, wherein said aqueous ink composition further comprises at least one organic solvent miscible with water, said organic solvent being present in an amount ranging from 0.1% by weight to 70% by weight, relative to the total weight of said aqueous ink composition.

9. Aqueous ink composition according to claim 1, wherein said aqueous composition has a viscosity, at 25° C., ranging from 1 mPa×s to $10^5$ mPa×s.

10. Method for the preparation of electrically organic conductive layers usable in photovoltaic cells (or solar cells), in printable electronics, in organic light-emitting diodes (OLEDs), in touch screens, and in antistatic coatings, comprising applying the aqueous ink composition of claim 1 to a surface.

11. The method of claim 10, wherein said at least one conductive polymer is selected from (co)polymers of a 3,4-dialkoxythiophene.

12. The method of claim 11, wherein said (co)polymer of a 3,4-dialkoxythiophene is poly(3,4-ethylenedioxythiophene) (PEDOT).

13. The method of claim 11, wherein said (co)polymer of a 3,4-dialkoxythiophene is used together with a polyanion selected from the group consisting of polyanions of polymeric carboxylic acids; and polyanions of polysulphonic acids.

14. The method of claim 11, wherein said (co)polymers of a 3,4-dialkoxythiophene are selected from the group consisting of
(co)polymers comprising repeating units having general formula (I):

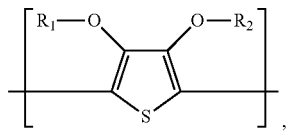

in which $R_1$ and $R_2$, identical or different, represent a hydrogen atom or are selected from $C_1$-$C_4$ alkyl groups; or $R_1$ and $R_2$ together represent a $C_1$-$C_5$ alkylene group or a cycloalkylene group;

(co)polymers of a 3,4-dialkoxythiophene in which the two alkoxy groups together represent an optionally substituted oxy-alkylene-oxy bridge;

(co)polymers of a 3,4-dialkoxythiophene in which the two alkoxy groups together represent an oxy-alkylene-oxy bridge optionally substituted with one or more groups selected from the group consisting of alkyl groups, alkoxy groups, alkyloxyalkyl groups, carboxyl groups, alkylsulphonate groups, arylsulphonate groups, and ester groups; and (co)polymers of a 3,4-dialkoxythiophene in which the two alkoxy groups together represent an oxy-alkylene-oxy bridge in which the alkylene group is selected from the group consisting of an optionally substituted 1,2-ethylene group; a methylene group optionally substituted with at least one alkyl group; a 1,2-ethylene group optionally substituted with at least one $C_1$-$C_{12}$ alkyl group; a 1,2-ethylene group optionally substituted with at least one phenyl group; a 1,3-propylene group; and a 1,2-cyclohexylene group.

15. The method of claim 10, wherein said conductive polymer is PEDOT: PSS [poly(3,4-ethylenedioxythiophene)-polystyrene sulphonate.

16. The method of claim 10, wherein said cellulose ether is selected from the group consisting of alkyl celluloses; hydroxyalkylcelluloses; hydroxyalkylalkylcelluloses; and mixtures thereof.

17. The method of claim 10, wherein said aqueous ink composition further comprises at least one compound selected from the group consisting of sulphoxides; aprotic liquids having a dielectric constant greater than 15; diols; sugars; and mixtures thereof.

18. The method of claim 10, wherein said aqueous ink composition further comprises at least one organic solvent miscible with water, wherein said at least one organic solvent amount ranges from 0.1% by weight to 70% by weight of said aqueous ink composition.

19. The method of claim 10, wherein said aqueous ink composition has a viscosity, at 25° C., ranging from 1 mPa×s to $10^5$ mPa×s.

* * * * *